(12) United States Patent
Pierrat

(10) Patent No.: US 6,218,089 B1
(45) Date of Patent: Apr. 17, 2001

(54) PHOTOLITHOGRAPHIC METHOD

(75) Inventor: Christophe Pierrat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/083,611

(22) Filed: May 22, 1998

(51) Int. Cl.[7] .................. G03F 7/20; G03F 9/00
(52) U.S. Cl. .................. 430/394; 430/5; 430/296; 430/312; 430/396
(58) Field of Search .................. 430/312, 394, 430/396, 5, 296

(56) References Cited

U.S. PATENT DOCUMENTS

| | | | |
|---|---|---|---|
| Re. 36,113 | * 2/1999 | Bruek | 430/311 |
| 4,426,584 | * 1/1984 | Bohlen | 250/492.2 |
| 4,746,587 | * 5/1988 | Nicholas | 430/5 |
| 4,890,309 | 12/1989 | Smith et al. | 378/35 |
| 4,902,899 | 2/1990 | Lin et al. | 250/492.1 |
| 5,242,770 | 9/1993 | Chen et al. | 430/5 |
| 5,340,700 | 8/1994 | Chen et al. | 430/312 |
| 5,447,810 | * 9/1995 | Chen | 430/5 |
| 6,087,046 | * 7/2000 | Nakasuji | 430/5 |

FOREIGN PATENT DOCUMENTS 2-126264 * 5/1990 (JP) .................. 430/396

* cited by examiner

Primary Examiner—Mark F. Huff
Assistant Examiner—Nicole Barreca
(74) Attorney, Agent, or Firm—Fletcher, Yoder & Van Someren

(57) ABSTRACT

Photolithographic methods and apparatus for reducing or eliminating the proximity effect. Multiple exposures using different exposure parameters are used to reduce or to eliminate the proximity effect.

25 Claims, 8 Drawing Sheets

PHOTOLITHOGRAPHIC METHOD

GOVERNMENT LICENSE RIGHTS

The U.S. Government has a paid-up license in this invention and the rights in limited circumstances to require the patent owner to license other on reasonable terms as provided for by the terms of Contract No. MDA972-92-C-0054 awarded by the Defense Advanced Research Projects Agency.

BACKGROUND OF THE INVENTION

1. Field Of The Invention

This invention relates generally to the field of integrated circuit manufacturing and, more particularly, to photolithographic techniques for use in the field of integrated circuit manufacturing.

2. Background Of The Related Art

As most people are aware, an integrated circuit is a highly miniaturized electronic circuit that is typically designed on a semiconductive substrate. The design and fabrication of an integrated circuit usually follows certain steps. First, engineers design an electrical circuit schematic, which defines the circuit's components, as well as their connectivity and general functionality. Engineers typically rely on computer simulation tools to create this circuit schematic and to simulate the electrical function that the circuit is intended to perform.

Once the schematic is complete, the circuit must be translated into a physical representation, commonly called a "layout." Computer aided design tools typically are used by layout designers to translate the schematic circuit into the shapes that will actually embody the devices themselves in the completed integrated circuit. These various shapes make up the individual components of the circuit, such as the transistors, isolation regions, and interconnections. The layout designs are typically quite complicated, especially for integrated circuits having upwards of 100,000 devices on a single semiconductor chip. Indeed, although a finished integrated circuit may appear to be flat, integrated circuits are actually multi-layered devices. Accordingly, the layout for each level must be carefully designed to create such a functional three dimensional circuit.

After the layout of the circuit has been completed, the layout must be transferred onto a semiconductive substrate in order to fabricate the integrated circuit. To accomplish this task, a process called "photolithography" is typically used. In a photolithographic process, the layout design for each level is transferred onto one or more photomasks. A typical photomask is a transparent substrate, such as quartz, which includes thin films of metal or other opaque materials that are formed on the substrate. These opaque materials prevent radiation, such as light or x-rays, from passing through the selected portions of the substrate. The resulting pattern created by the transparent and opaque regions defines the layout.

To transfer the layout design from the photomask onto the semiconductor substrate, a photosensitive polymer film, called photoresist, is normally applied to the semiconductive substrate. The photomask is located between the photoresist and an exposure tool, which is a selected source of light or other types of radiation. The radiation passes through the transparent portions of the photomask and causes the corresponding irradiated portions of the photoresist to change solubility. After exposure, the semiconductive substrate is treated to develop the photomask images that have been transferred onto the photoresist. This treatment typically involves the application of a solvent onto the photoresist layer to remove the soluble portions of the photoresist. The photoresist mask that is created as a result of this developing procedure is then used to create certain device features of the circuit on the semiconductive substrate.

Photolithography has been used for many years in the fabrication of integrated circuits. As integrated circuits have become smaller and more densely packed, the photolithographic processes used to fabricate such circuits have undergone a number of changes and improvements to meet the ever increasing demands for fabricating such circuits. For instance, resolution is one of the limiting characteristics of the exposure tool. The resolution of an exposure tool is typically defined as the minimum feature that the exposure tool can repeatedly expose onto the photoresist. Currently, there is a need to produce elements of electrical circuits at sizes that are close to or below the resolution limit of available exposure tools. Indeed, various methods have been developed for creating certain features that are actually smaller than currently achievable photolithographic resolution. However, even excluding situations where such extremely small features are desirable, as other critical dimensions of the layout become smaller and approach the resolution limit of the photolithographic process, it becomes increasingly difficult to reproduce the photomask layout onto the photoresist in a consistent manner.

It has been found that differences in the development of circuit features on the photoresist depends on the proximity of the features to one another. In photolithography, this occurrence is typically called the "proximity effect." The proximity effect causes a feature on a photolithographic mask to be patterned into a photoresist differently depending on whether the feature is isolated from or adjacent to other features on the mask. The proximity effect results from diffraction in the photolithographic exposure tool, and it may also result from photoresist processing or subsequent etching. Specifically, the radiation diffracts around adjacent opaque features on the mask and interacts in such a way as to produce pattern dependent variations. In other words, when two features are in close proximity to one another, the diffracted radiation integrates and combines.

For example, lines designed to have the same dimension will transfer onto the photoresist differently depending upon whether the lines are isolated from one another or densely packed together. If these lines are relatively isolated from one another, so that the proximity effect is not a concern, the lines tend to transfer generally as designed. However, if the lines are densely packed together, the proximity effect causes the photoresist to receive some radiation between each line due to the diffractive interactions. Accordingly, because the proximity effect causes more of the photoresist to be exposed to the radiation, the group of densely packed lines tends to transfer differently onto the photoresist when compared with the isolated line.

Numerous methods have been developed in attempts to overcome the proximity effect. One method for reducing the problems caused by the proximity effect involves the biasing of the photomask. The dimensions of the layout design on the photomask are selectively adjusted to precompensate certain mask features so that the final target dimensions that are transferred onto the photoresist are consistent with the non-compensated features. Continuing the example mentioned above, it has been found that, under certain exposure conditions, the final line width for isolated features may be larger than the final line width of densely packed features when utilizing a positive photoresist. To reduce the inconsistency, designers have created mask patterns in which the original mask line width of the isolated features is smaller than the original mask line width of the densely packed features. By precompensating the mask pattern in this fashion, the final line width created on the photoresist for the isolated features and for the densely packed features is approximately the same.

Unfortunately, this biasing technique exhibits certain disadvantages. One problem with the biasing approach is that it requires empirical trial and error and is heavily dependent on the exposure tool, the photoresist, and the developer. Consequently, variations in any of these factors can have an adverse impact on the biased features. Such an impact typically results in the need for mask revisions, which are very expensive and have long lead times that can drastically affect production schedules. Another problem of the biasing approach is the fact that increasing the thickness of the photoresist reduces the impact of the proximity effect caused by the photoresist process. As a result, at a certain photoresist thickness, the proximity effect can be minimized for a given exposure tool. However, by increasing the thickness of the photoresist to compensate for the proximity effect, the photoresist becomes too thick to create features at the resolution limit of the photolithographic process. Thus, biasing typically offers an unsatisfactory solution to problems caused by the proximity effect.

The present invention may be applicable to one or more of the problems discussed above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a photolithographic method that includes the steps of: (a) providing a substrate having a layer of photoresist thereon; (b) placing a photomask between the layer of photoresist and a source of radiation; (c) exposing the layer of photoresist to radiation from the source through the photomask using a first set of exposure parameters; and (d) exposing the layer of photoresist to radiation from the source through the photomask using a second set of exposure parameters different from the first set of exposure parameters.

In accordance with another aspect of the present invention, there is provided a photolithographic method that includes the steps of: (a) providing a substrate having a layer of photoresist thereon; (b) irradiating the layer of photoresist through a photomask using a first type of exposure; and (c) irradiating the layer of photoresist through a photomask using a second type of exposure, wherein combined effects of the first type of exposure and the second type of exposure reduce proximity effects as compared with the first type of exposure and the second type of exposure separately.

In accordance with still another aspect of the present invention, there is provided a photolithographic method that includes the steps of: (a) providing a substrate having a layer of photoresist thereon; (b) placing a photomask between the layer of photoresist and a source of radiation; (c) irradiating the layer of photoresist through the photomask using an on-axis exposure; and (d) irradiating the layer of photoresist through the photomask using an off-axis exposure.

In accordance with yet another aspect of the present invention, there is provided a photolithographic method of reducing proximity effects of features formed near a photolithographic resolution limit. The method includes the steps of: (a) providing a substrate having a layer of photoresist thereon; (b) placing a photomask between the layer of photoresist and a source of radiation, the photomask having features to be formed near the photolithographic resolution limit; (c) irradiating the layer of photoresist through the photomask using an on-axis exposure; and (d) irradiating the layer of photoresist through the photomask using an off-axis exposure.

In accordance with a further aspect of the present invention, there is provided a photolithographic method that includes the steps of: (a) providing a substrate having a layer of photoresist thereon; (b) placing a first photomask between the layer of photoresist and a source of radiation; (c) irradiating the layer of photoresist through the first photomask; (d) removing the first photomask; (e) placing a second photomask between the layer of photoresist and the source of radiation; and (f) irradiating the layer of photoresist through the second photomask.

In accordance with an even further aspect of the present invention, there is provided a photolithographic method that includes the steps of: (a) providing a substrate having a layer of photoresist thereon; (b) irradiating the layer of photoresist through a positive photomask; and (c) irradiating the layer of photoresist through a negative photomask.

In accordance with a still further aspect of the present invention, there is provided a photolithographic method that includes the steps of: (a) providing a substrate having a layer of photoresist thereon; (b) placing a photomask between the layer of photoresist and a source of radiation, the photomask having at least one region of densely packed features of a given width and having at least one region of relatively isolated features of the given width; (c) exposing the layer of photoresist to radiation from the source through the photomask using a first set of exposure parameters, the first set of parameters causing the densely packed features to transfer onto the photoresist in a first width and causing the relatively isolated features to transfer onto the photoresist in a second width, the first width being less than the second width; and (d) exposing the layer of photoresist to radiation from the source through the photomask using a second set of exposure parameters different from the first set of exposure parameters, the second set of parameters causing the densely packed features to transfer onto the photoresist in a third width and causing the relatively isolated features to transfer onto the photoresist in a fourth width, the third width being greater than the fourth width.

In accordance with a yet further aspect of the present invention, there is provided an apparatus for reducing proximity effects. The apparatus includes an exposure tool for providing at least a first illumination condition and a second illumination condition. A photomask is adapted for placement between the exposure tool and a substrate. The exposure tool illuminates the substrate through the photomask using the first illumination condition, and the exposure tool illuminates the substrate through the photomask using the second illumination condition.

BRIEF DESCRIPTION OF THE DRAWINGS

Certain advantages of the invention may become apparent upon reading the following detailed description and upon reference to the drawings in which.

DETAILED DESCRIPTION OF SPECIFIC EMBODIMENTS

The methods described below involve the use of multiple exposures along with changing the exposure parameters of the photolithographic imaging tool to reduce the proximity effect. It should be noted that these methods may be applicable to many forms of photolithography, including, for example, laser based deep UV, non-laser based deep UV, and x-ray photolithography.

Figure 1:
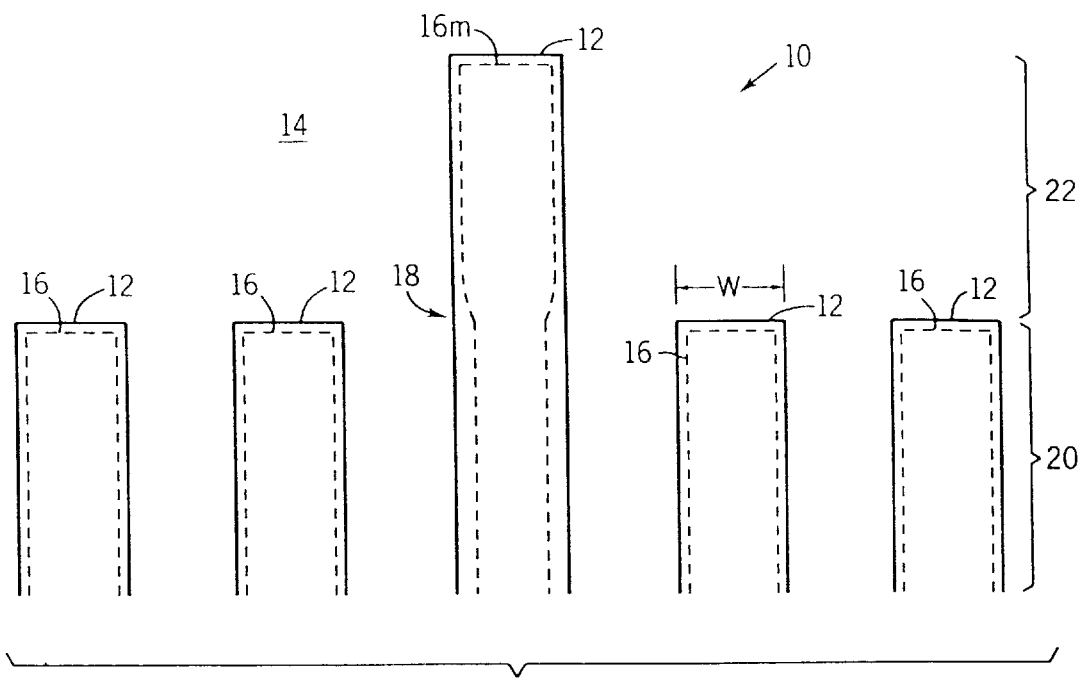
FIG. 1 illustrates the proximity effect for a particular photomask pattern.

Turning now to the drawings, and referring initially to FIG. 1, a portion 10 of a photomask is shown. The portion 10 of the photomask illustrates five lines 12 defined by opaque regions of the photomask. By irradiating a photoresist-cover substrate 14 which underlies the portion 10 of the photomask with appropriate radiation, five lines 16 may be patterned, i.e., transferred, onto the photoresist-cover substrate 14. It is typically desirable that all five lines 16 be patterned with a width substantially equal to the width W of the lines 12 on the photomask. However, because of the proximity effect, the width of middle line 16m begins to enlarge at a point 18 where middle line 16m traverses from a densely spaced region of lines 20 to an isolated region of lines 22. Thus, it can be seen that the proximity effect can cause lines to be produced having inconsistent widths.

Figure 2:
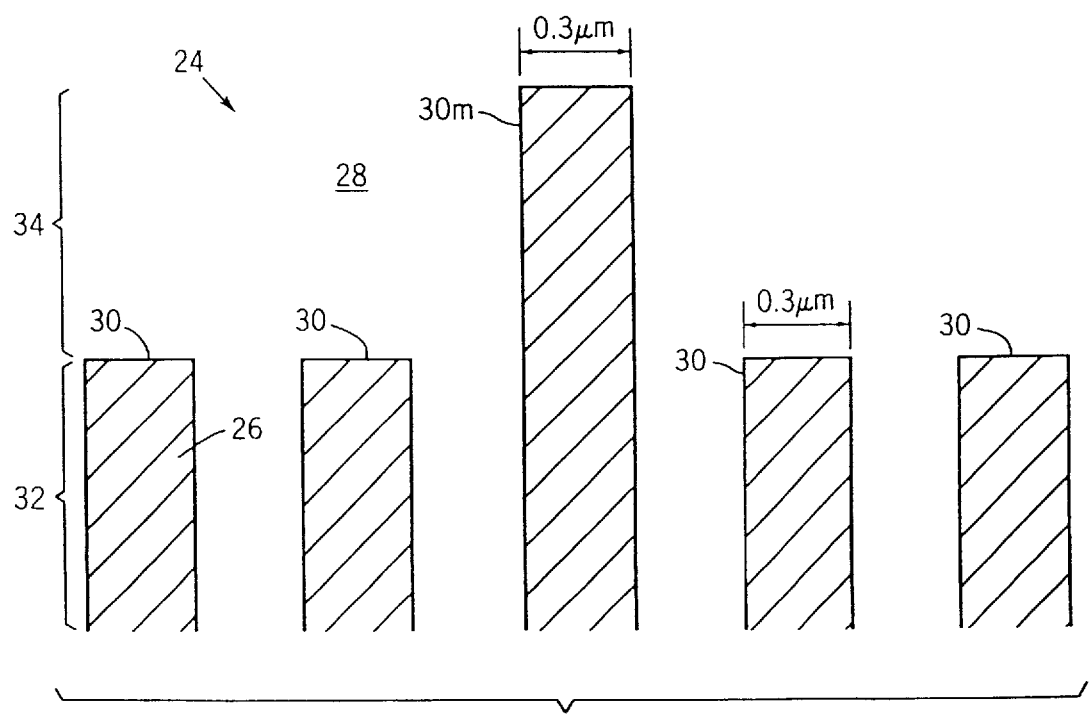
FIG. 2 illustrates a portion of a photomask pattern which shows the line width dimensions of the dense and isolated features.

A portion 24 of a similar photomask is illustrated in FIG. 2. The crosshatched areas 26 of the portion 24 designate opaque regions of the photomask, and the white areas 28 designate transparent regions of the photomask. Like the portion 10 of the photomask in FIG. 1, the portion 24 of the photomask in FIG. 2 includes five lines 30, where the middle line 30m extends from a region 32 of densely packed lines to a relatively isolated region 34. It should be noted that both the isolated line 30m and the dense lines 30 have the same line width of 0.3 microns in this example.

Figure 3:
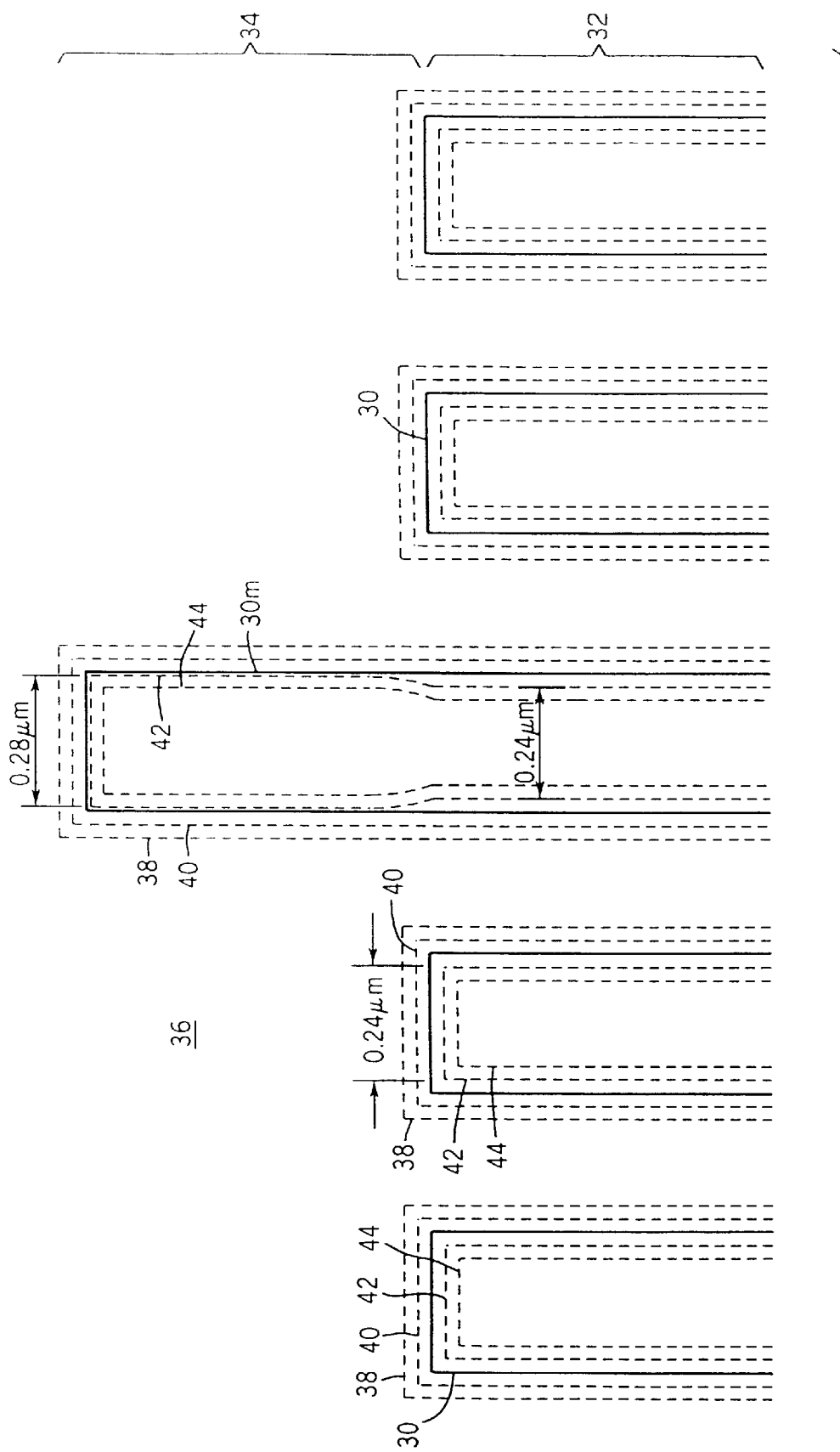
FIG. 3 illustrates radiation intensity on a photoresist during a first exposure using the photomask of FIG. 2.

When the portion 24 of the photomask of FIG. 2 is placed over a photoresist-covered substrate 36 and irradiated, the resulting irradiation of the photoresist may be similar to that illustrated in FIG. 3. The exposure parameters used for this irradiation are 0.7 coherence, 0.0 micron focus, 0.48 numerical aperture, and on-axis exposure. The lines 30 represent the opaque region of the photomask of FIG. 2. Optimally, no light should be incident on the photoresist-covered substrate 36 in that region. The dashed lines 38, 40, 42, and 44 illustrate examples of contours of radiation intensity, and these lines 38, 40, 42, and 44 demonstrate that the radiation intensity becomes greater in a direction away from the opaque regions of the photomask. However, because of diffraction, some radiation is incident under the opaque regions of the photomask, as illustrated by the dashed lines 42 and 44.

With a positive resist, the low intensity regions defined by the dashed line 44 would correspond to a line in the photoresist layer on substrate 36 if development were to occur after this first exposure, while the higher intensity regions defined by the lines 38, 40, and 42 correspond to regions where the photoresist layer on substrate 36 would be removed with a developer. Accordingly, the intensity contour illustrated by the dashed line 44 will be used to measure the proximity effect. However, it should be understood that the energy required to image the photoresist line would depend upon the characteristics of the photoresist and the developer.

As illustrated in FIG. 3, the photoresist lines in the highly dense region 32 would be smaller than the photoresist lines in the isolated region 34. In this example, the photoresist lines in the highly dense region 32 are 0.24 microns wide, while the photoresist lines in the isolated region 34 are 0.28 microns wide, resulting in about a 15% difference between the width of the isolated and dense lines. However, by utilizing multiple exposures, and by changing the exposure parameters in subsequent exposures, as illustrated by the examples discussed below, the proximity effect can be reduced. Of course, it should be understood that the exposure parameters selected to reduce or eliminate the proximity effect will depend on various factors, such as the characteristics of the photolithographic imaging tool, the type of photoresist material being used, and the developer.

Figure 4:
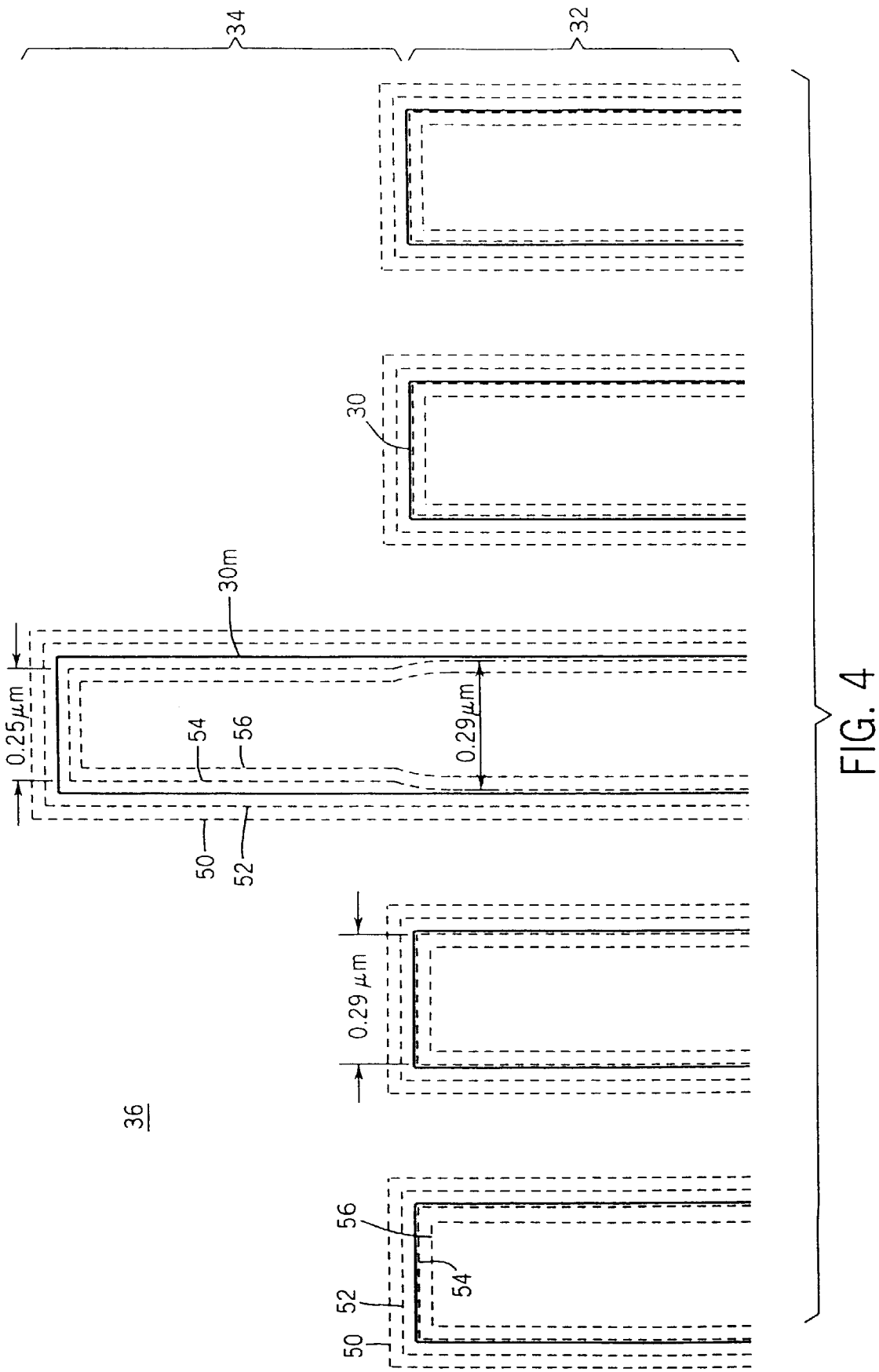
FIG. 4 illustrates radiation intensity on a photoresist during a second exposure using the FIG. 5 illustrates radiation intensity on a photoresist as a result of a combination of the exposures of FIGS. 3 and 4.

One exposure parameter than can be changed is the axis of exposure. To change the axis of exposure, an object, such as a blade, can be situated in the exposure tool to block radiation emanating from the center of the radiation source. This is typically called off-axis exposure. FIG. 4 illustrates the radiation intensity on the photoresist-covered substrate 36 utilizing the same exposure parameters as FIG. 3 except that off-axis exposure is used. As in FIG. 3, the lines 30 represent the opaque region of the photomask of FIG. 2. The dashed lines 50, 52, 54, and 56 illustrate examples of contours of radiation intensity, and these lines 50, 52, 54, and 56 demonstrate that the radiation intensity becomes greater in a direction away from the opaque regions of the photomask. However, because of diffraction, some radiation is incident under the opaque regions of the photomask, as illustrated by the dashed lines 54 and 56.

It should be noted that the off-axis exposure causes the width of the densely packed lines in the region 32 to be greater than the width of the isolated lines in the region 34. In this example, the photoresist lines in the highly dense region 32 are 0.29 microns wide, while the photoresist lines in the isolated region 34 are 0.25 microns wide, again resulting in about a 15% difference between the width of the isolated and dense lines. Because the second exposure produces results that are opposite the results of the first exposure, the proximity effect may be reduced by exposing the photoresist twice using different exposure parameters and using the same photomask.

Figure 5:
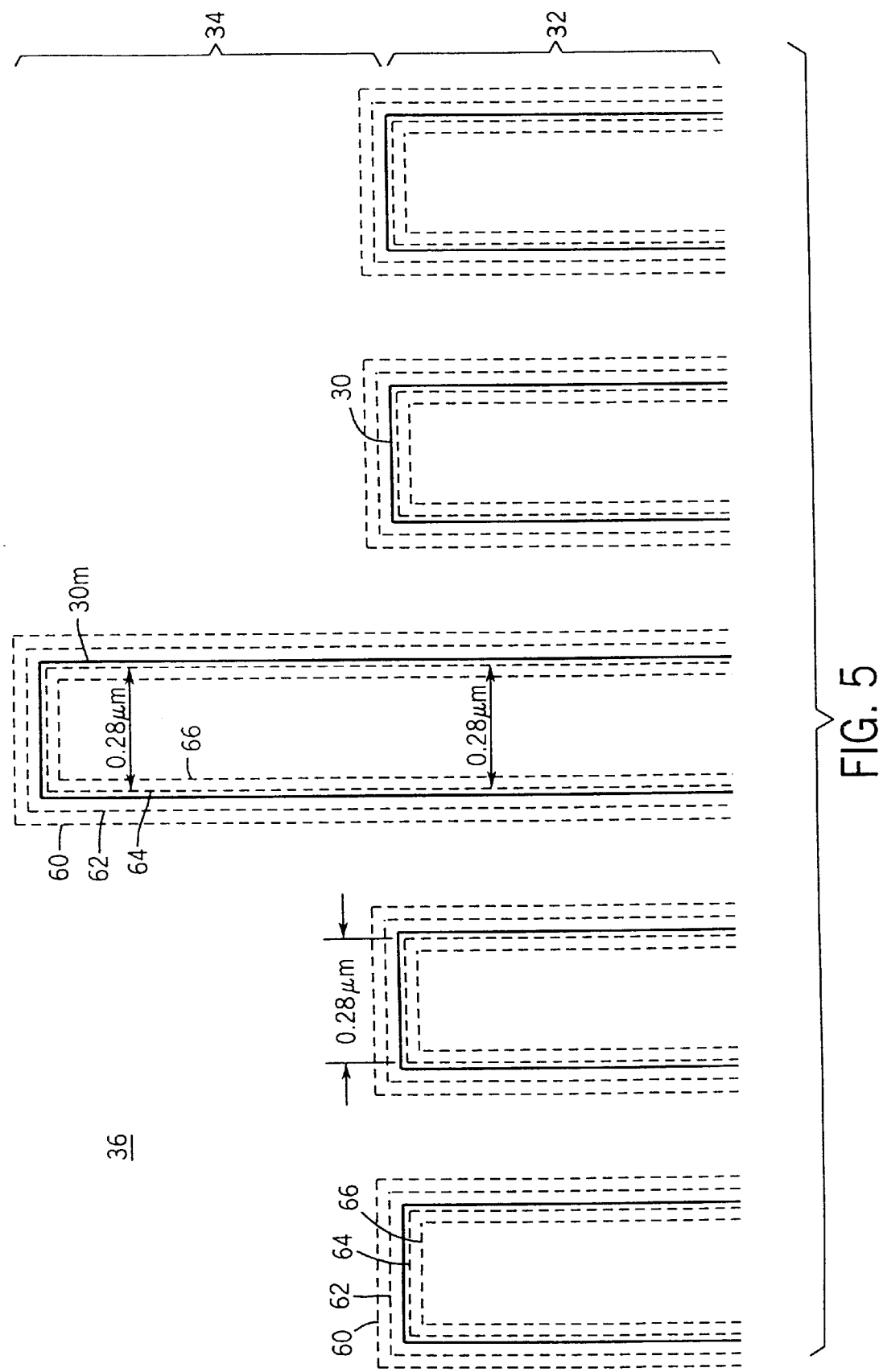

An illustration of the reduction in the proximity effect when using these two exemplary exposures may be found in FIG. 5. First, the photoresist-covered substrate 36 is irradiated with a 50% dose of radiation using the exposure parameters set forth in regard to FIG. 3. Next, the photoresist-covered substrate 36 is irradiated with a 50% dose using the exposure parameters set forth in regard to FIG. 4. The resulting radiation intensity contours are illustrated by the dashed lines 60, 62, 64, and 66. It should be noted that the radiation intensity contours are essentially the same in both the densely packed region 32 and the isolated region 34. Thus, after development, the widths of the densely packed lines transferred to the photoresist will be essentially the same as the width of the relatively isolated lines transferred to the photoresist In this example, the width of each photoresist line is 0.28 microns.

Figure 6:
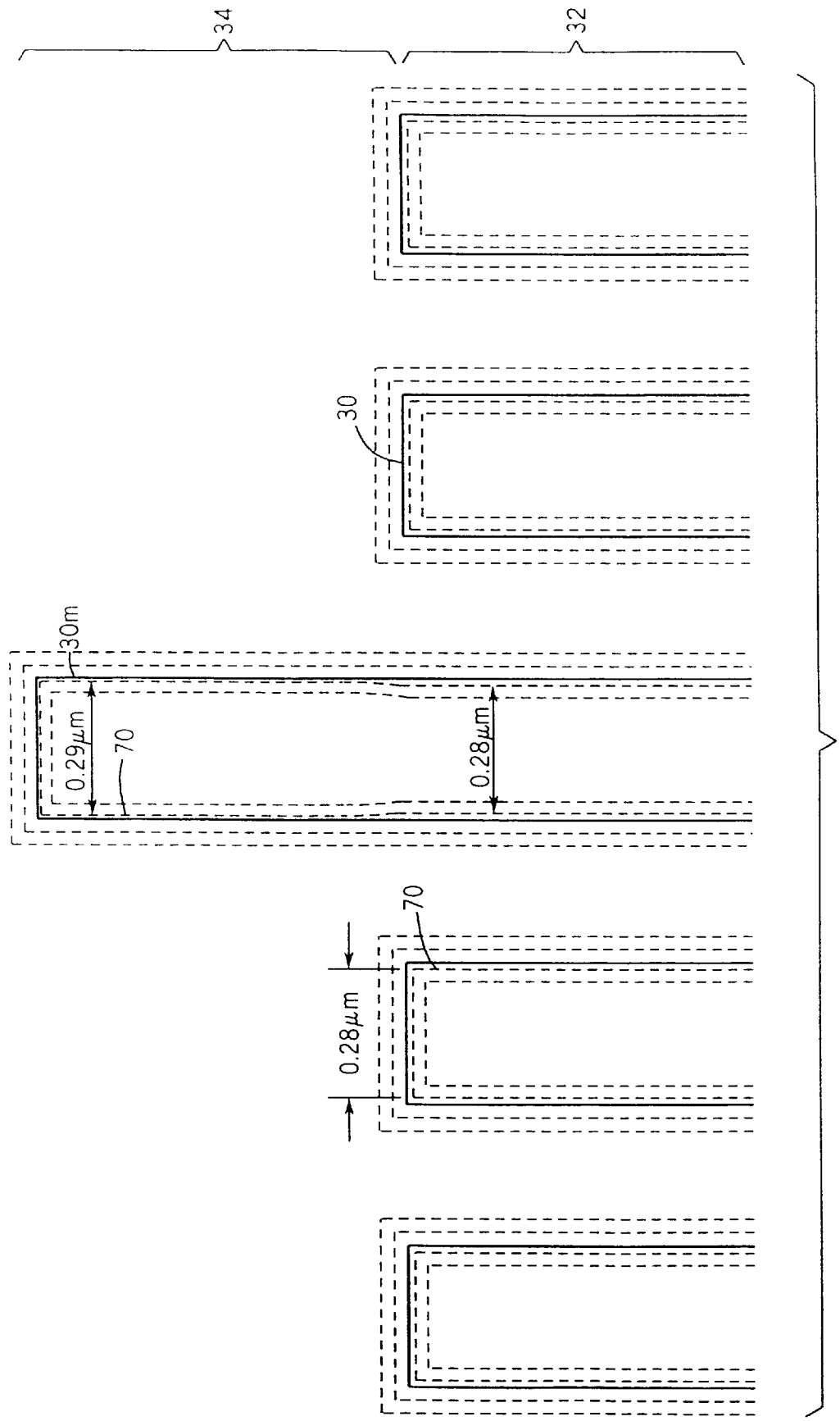
FIG. 6 illustrates radiation intensity on a photoresist as a result of the exposure of FIG. 3 and a second exposure where the coherence and focus of the second exposure was varied from the first exposure.

In addition to the second off-axis exposure, the other exposure parameters can be varied to reduce the proximity effect. These other exposure parameters may include, depending upon the particular situation, coherence, focus, and/or numerical aperture. For example, the photoresist-covered substrate 36 may be irradiated with a 50% dose using the exposure parameters discussed in regard to FIG. 3. The photoresist-covered substrate 36 may then be irradiated with a 50% dose using the same parameters except for changing the coherence from 0.7 in the first exposure to 0.5 in the second exposure and changing the focus from 0.0 micron in the first exposure to ±0.75 micron in the second exposure. FIG. 6 illustrates the radiation intensity contours on the photoresist-covered substrate 36 using the photomask of FIG. 2 and this double exposure. The radiation intensity contour represented by the dashed line 70 defines the width of each line transferred to the photoresist. In this example, the photoresist lines in the high density region 32 are 0.29 microns wide, while the photoresist lines in the isolated region 34 are 0.28 microns wide. Thus, this double exposure results in about a 3% difference between the width of the isolated and dense lines as compared with about a 15% difference for the single exposure.

Another exposure parameter that may be varied is the types of photomasks that are used in the multiple exposures. For example, the photoresist-covered substrate 36 may be irradiated with a 50% dose using the exposure parameters discussed in regard to FIG. 3. The photoresist-covered substrate 36 may then be irradiated with a 50% dose using the same parameters, except for the photomask. Instead of using the photomask 24 of FIG. 2 for this second exposure, a reverse tone photomask is used. The reverse tone photomask is a photomask in which the opaque regions of the photomask of FIG. 2 become transparent regions, and the transparent regions of the photomask of FIG. 2 become opaque regions.

Figure 7:
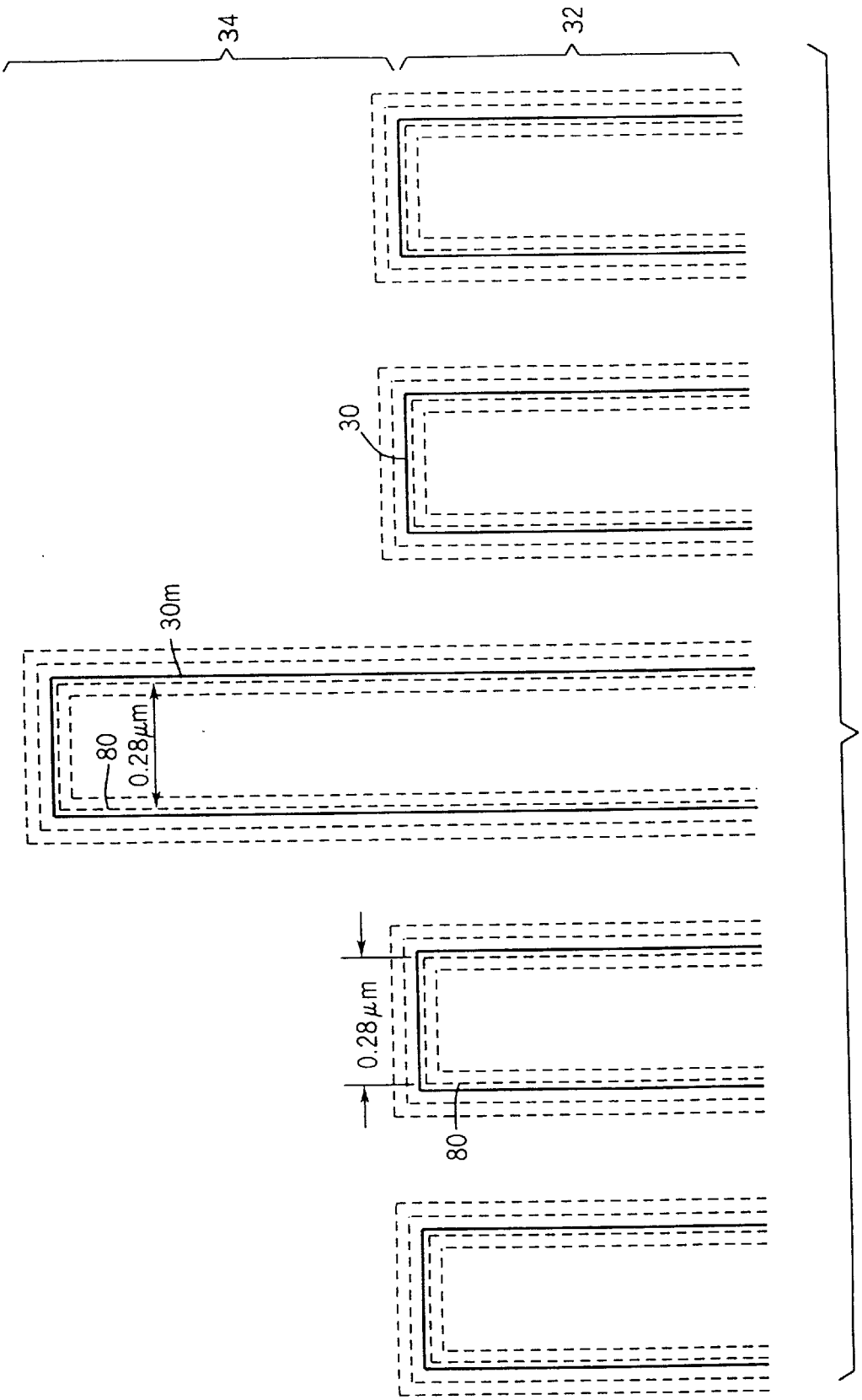
FIG. 7 illustrates radiation intensity on a photoresist as a result of the exposure of FIG. 3 and a second exposure using a reverse tone photomask of FIG. 2.

FIG. 7 illustrates the radiation intensity contours on the photoresist-covered substrate 36 using the photomask of FIG. 2 for the first exposure and using the reverse tone photomask for the second exposure. The radiation intensity contour represented by the dashed line 80 defines the width of each line transferred to the photoresist In this example, the photoresist lines in the high density region 32 are 0.28 microns wide, and the photoresist lines in the isolated region 34 are also 0.28 microns wide. Thus, this double exposure results in substantial removal of the proximity effect caused by a single exposure.

Figure 8:
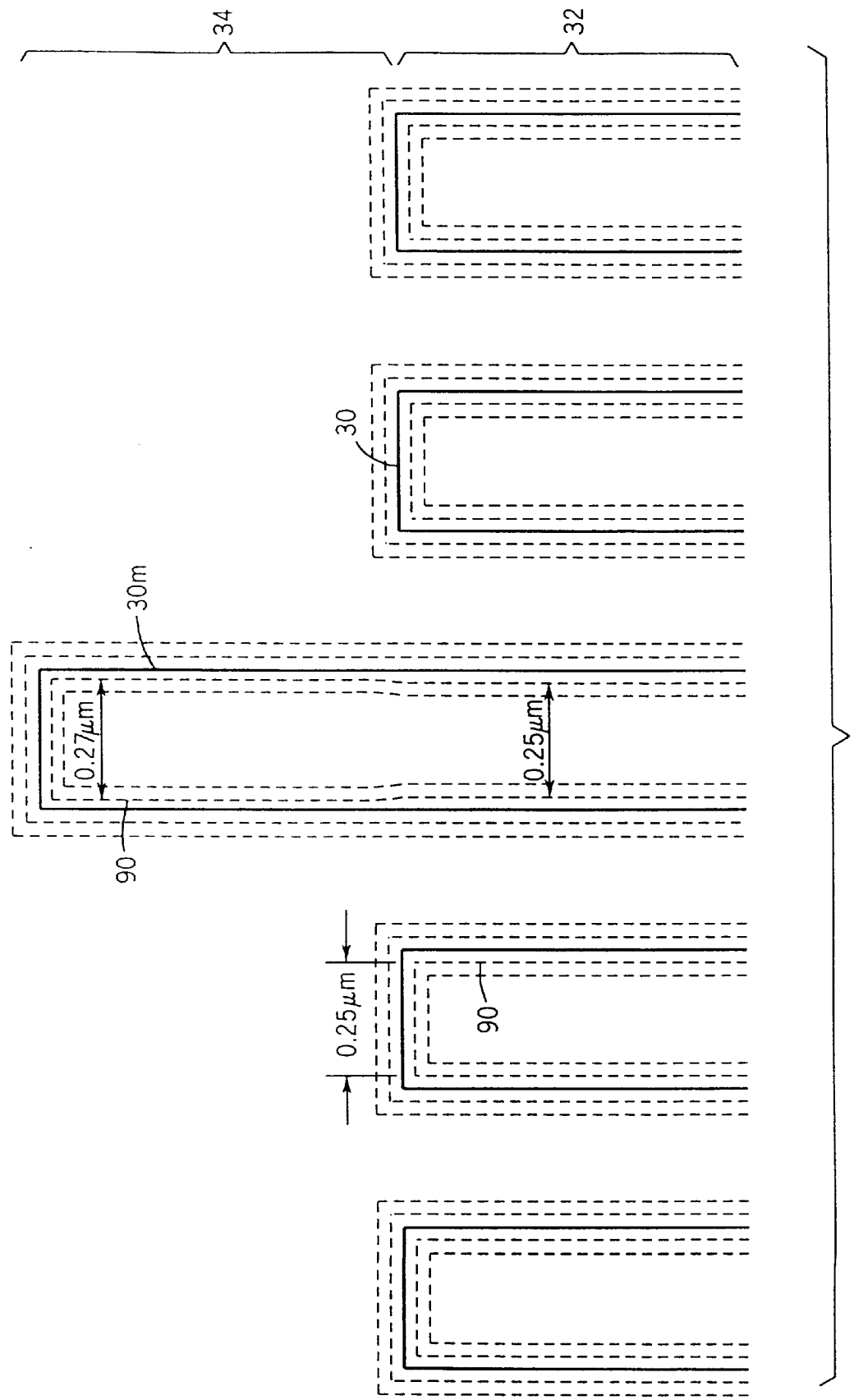
FIG. 8 illustrates another radiation intensity on a photoresist as a result of the exposure of FIG. 3 and a second exposure using a reverse tone photomask of FIG. 2.

It should be understood that other variations may also reduce or eliminate the proximity effect. For example, FIG. 8 shows that the proximity effect can be reduced by using another combination of exposures through a normal tone photomask and a reverse tone photomask. The first exposure uses the normal tone photomask at a dose of about 90% using the parameters discussed above in regard to FIG. 3. The second exposure uses the reverse tone photomask at a dose of about 10% using the same parameters. The radiation intensity contour represented by the dashed line 90 defines the width of each line transferred to the photoresist. In this example, the photoresist lines in the high density region 32 are 0.25 microns wide, while the photoresist lines in the isolated region 34 are 0.27 microns wide. Thus, this double exposure results in about an 8% difference between the width of the isolated and dense lines as compared with about a 15% difference for the single exposure.

Figure 9:
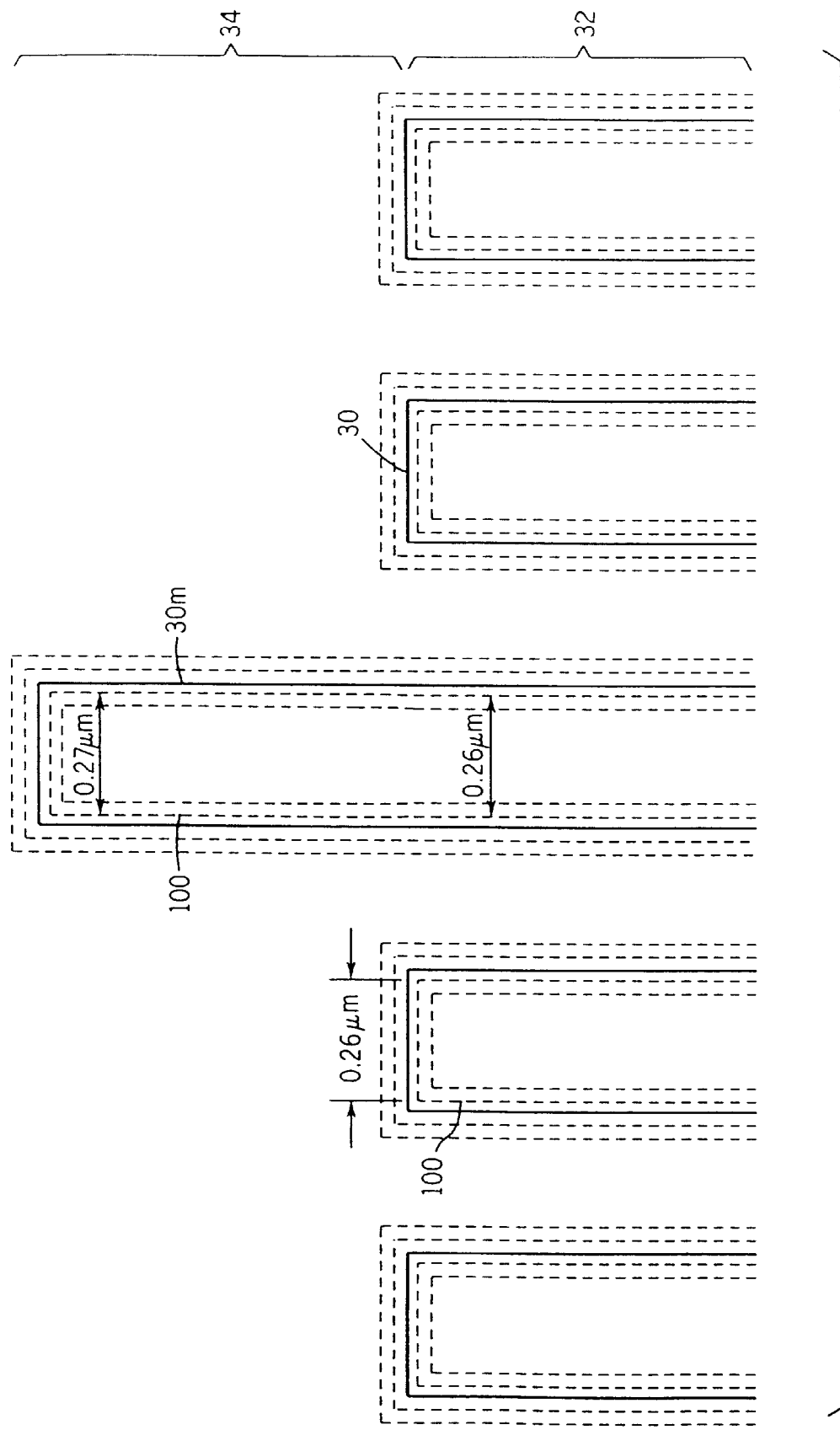
FIG. 9 illustrates yet another radiation intensity on a photoresist as a result of the exposure of FIG. 3 and a second exposure using a reverse tone photomask of FIG. 2.

As yet another example of reducing the proximity effect by varying the exposure parameters, attention is now drawn to FIG. 9. In this example, the first exposure uses the normal tone photomask at a dose of 80% of that used in regard to FIG. 3, where the parameters are the same except that the coherence changes from 0.7 to 0.5, and the focus changes from 0.0 to 1.0 micron. The second exposure uses the reverse tone photomask at a dose of 20% of that used in regard to FIG. 3, where parameters are the same as those in FIG. 3 except that the NA changes from 0.48 to 0.42, and the focus changes from 0.0 to 0.5 micron. The radiation intensity contour represented by the dashed line 100 defines the width of each line transferred to the photoresist. In this example, the photoresist lines in the high density region 32 are 0.26 microns wide, while the photoresist lines in the isolated region 34 are 0.27 microns wide. Thus, this double exposure results in about a 4% difference between the width of the isolated and dense lines as compared with about a 15% difference for the single exposure.

While the invention may be susceptible to various modifications and alternative forms, specific embodiments have been shown by way of example in the drawings and have been be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A photolithographic method to reduce proximity effect, the method comprising the steps of:

(a) providing a substrate having a layer of photoresist thereon;

(b) placing a photomask between the layer of photoresist and a source of radiation, the photomask having a plurality of densely packed features having a first width and a plurality of relatively isolated features having a second width substantially the same as the first width;

(c) exposing the layer of photoresist to radiation from the source through the photomask using a first set of exposure parameters, such that the densely packed features have a first transferred width and the isolated features have a second transferred width when transferred to the layer of photoresist the first transferred width being different than the second transferred width;

(d) exposing the layer of photoresist to radiation from the source through the photomask using a second set of exposure parameters different from the first set of exposure parameters; an (e) developing the layer of photoresist, wherein the second set of exposure parameters causes a developed first width of the densely packed features to be substantially the same as a developed second width of the relatively isolated features.

2. The method, as set forth in claim 1, wherein the first set of parameters varies from the second set of parameters to reduce proximity effect as compared with performing only one of steps (c) and (d).

3. The method, as set forth in claim 1, wherein step (c) comprises the step of:
   performing an on-axis exposure.

4. The method, as set forth in claim 1, wherein step (d) comprises the step of:
   performing an off-axis exposure.

5. The method, as set forth in claim 1, wherein the first set of parameters comprises a first coherence, focus, numerical aperture, and axis of exposure, wherein the second set of parameters comprises a second coherence, focus, numerical aperture, and axis of exposure, and wherein at least one of the first coherence, focus, numerical aperture, and axis of exposure differs from at least one of the second coherence, focus, numerical aperture, and axis of exposure.

6. A photolithographic method to reduce proximity effect, the method comprising the steps of:
   (a) providing a substrate having a layer of photoresist thereon;
   (b) irradiating the layer of photoresist through a photomask using a first type of exposure, the first type of exposure comprising an on-axis exposure, wherein the photomask comprises a first region of features having a first feature density and a second region of relatively isolated features having a second feature density, and wherein a feature in the first region has a first width that is substantially the same as a second width of a feature in the second region; and
   (c) irradiating the layer of photoresist through a photomask using a second type of exposure, the second type of exposure comprising an off-axis exposure, wherein combined effects of the first type of exposure and the second type of exposure reduce a difference between the first and second widths transferred onto the layer of photoresist caused by the proximity effect as compared with the first type of exposure and the second type of exposure individually.

7. The method, as set forth in claim 6, wherein the first type of exposure comprises a first set of parameters having a first coherence, focus, and numerical aperture, wherein the second type of exposure comprises a second set of parameters having a second coherence, focus, and numerical aperture, and wherein at least one of the first coherence, focus, and numerical aperture differs from at least one of the second coherence, focus, and numerical aperture.

8. The method, as set forth in claim 6, wherein step (b) comprises the step of using a photomask having features at about a photolithographic resolution limit, and wherein step (c) comprises the step of using a photomask having features at about the photolithographic resolution limit.

9. The method, as set forth in claim 6, wherein steps (b) and (c) use the same photomask.

10. The method, as set forth in claim 6, wherein step (b) comprises the step of using a first photomask, and wherein step (c) comprises the step of using a second photomask, the second photomask being a reverse tone of the first photomask.

11. A photolithographic method comprising the steps of:
    (a) providing a substrate having a layer of photoresist thereon;
    (b) placing a photomask between the layer of photoresist and a source of radiation, the photomask comprising a plurality of features, each of the features having a substantially same width the features including densely packed features and relatively isolated features;
    (c) irradiating the layer of photoresist through the photomask using a first set of parameters to transfer the features onto the layer of photoresist, the first set of parameters comprising an on-axis exposure and a first coherence, focus, and numerical aperture, wherein a transferred width of the densely packed features is different than a transferred width of the relatively isolated features;
    (d) irradiating the layer of photoresist through the photomask using a second set of parameters comprising an off-axis exposure and a second coherence, focus, and numerical aperture, wherein at least one of the second coherence, focus, and numerical aperture differs from the first coherence, focus, and numerical aperture; and
    (f) developing the layer of photoresist, wherein the second set of parameters causes a developed width of the densely packed features to be substantially the same as a developed width of the relatively isolated features.

12. A photolithographic method of reducing proximity effect of features formed near a photolithographic resolution limit, the method comprising the steps of:
    (a) providing a substrate having a layer of photoresist thereon;
    (b) placing a photomask between the layer of photoresist and a source of radiation, the photomask having features to be formed near the photolithographic resolution limit, the features including densely packed features having a first width and relatively isolated features having a second width substantially the same as the first width;
    (c) irradiating the layer of photoresist through the photomask using a first set of parameters comprising an on-axis exposure and a first coherence, focus, and numerical aperture to transfer the features onto the layer of photoresist, wherein results of the proximity effect include the transferred densely packed features to having a third width and the transferred relatively isolated features having a fourth width different than the third width; and
    (d) irradiating the layer of photoresist through the photomask using a second set of parameters comprising an off-axis exposure and a second coherence, focus, and numerical aperture, wherein a least one of the second coherence, focus, and numerical aperture differs from the first coherence, focus, and numerical aperture to counter the results of the proximity effect in step (c).

13. The method, as set forth in claim 12, wherein the first coherence is 0.7, the first focus is 0.0, the second coherence is 0.5, and the second focus is 0.75 micron.

14. A photolithographic method comprising the steps of:
    (a) providing a substrate having a layer of photoresist thereon;
    (b) placing a first photomask between the layer of photoresist and a source of radiation, the first photomask having a plurality of features including densely packed features having a first width and relatively isolated features having a second width substantially the same as the first width;
    (c) irradiating the layer of photoresist through the first photomask using a first set of exposure parameters to transfer the features onto the layer of photoresist, wherein a proximity effect causes the transferred densely packed features to have a first transferred width and the transferred relatively isolated features to have a second transferred width different than the first transferred width;

(d) removing the first photomask;

(e) placing a second photomask between the layer of photoresist and the source of radiation; and (f) irradiating the layer of photoresist through the second photomask using a second set of exposure parameters comprising an off-axis exposure, the second photomask and the second set of exposure parameters countering the proximity effect of step (c).

15. The method, as set forth in claim 14, wherein step (c) comprises the step of: performing an on-axis exposure.

16. The method, as set forth in claim 14, wherein step (c) comprises the step of using a first set of parameters having a first coherence, focus, and numerical aperture, wherein step (f) comprises the step of using a second set of parameters having a second coherence, focus, and numerical aperture, and wherein at least one of the first coherence, focus, and numerical aperture differs from at least one of the second coherence, focus, and numerical aperture.

17. The method, as set forth in claim 14, wherein the second photomask is a reverse tone of the first photomask.

18. A photolithographic method comprising the steps of:

(a) providing a substrate having a layer of photoresist thereon;

(b) irradiating the layer of photoresist through a positive photomask using an on-axis exposure, the positive photomask having a plurality of features including densely packed features and relatively isolated features, the densely packed features having a first width substantially the same as a second width of the relatively isolated features, wherein the irradiating transfers the features onto the layer of photoresist such that the transferred first width of the densely packed features is different than the transferred second width of the relatively isolated features;

(c) irradiating the layer of photoresist through a negative photomask using an off-axis exposure; and (d) developing the layer of photoresist to develop the transferred features, wherein the developed first width of the densely packed features is substantially the same as the developed second width of the relatively isolated features.

19. The method, as set forth in claim 18, wherein step (b) comprises the step of using a first set of parameters having a first coherence, focus, and numerical aperture, wherein step (c) comprises the step of using a second set of parameters having a second coherence, focus, and numerical aperture, and wherein at least one of the first coherence, focus, and numerical aperture differs from at least one of the second coherence, focus, and numerical aperture.

20. A photolithographic method comprising the steps of:

(a) providing a substrate having a layer of photoresist thereon;

(b) placing a photomask between the layer of photoresist and a source of radiation, the photomask having at least one region of densely packed features of a given width and having at least one region of relatively isolated features of the given width;

(c) exposing the layer of photoresist to radiation from the source through the photomask using a first set of exposure parameters, the first set of parameters causing the densely packed features to transfer onto the photoresist in a first width and causing the relatively isolated features to transfer onto the photoresist in a second width, the first width being less than the second width; and (d) exposing the layer of photoresist to radiation from the source through the photomask using a second set of exposure parameters different from the first set of exposure parameters, the second set of parameters causing the densely packed features to transfer onto the photoresist in a third width and causing the relatively isolated features to transfer onto the photoresist in a fourth width, the third width being greater than the fourth width and substantially the same as the second width.

21. The method, as set forth in claim 20, wherein the first set of parameters varies from the second set of parameters to reduce proximity effect as compared with performing only one of steps (c) and (d).

22. The method, as set forth in claim 20, wherein step (c) comprises the step of:

performing an on-axis exposure.

23. The method, as set forth in claim 20, wherein step (d) comprises the step of:

performing an off-axis exposure.

24. The method, as set forth in claim 20, wherein the first set of parameters comprises a first coherence, focus, numerical aperture, and axis of exposure, wherein the second set of parameters comprises a second coherence, focus, numerical aperture, and axis of exposure, and wherein at least one of the first coherence, focus, numerical aperture, and axis of exposure differs from at least one of the second coherence, focus, numerical aperture, and axis of exposure.

25. The method, as set forth in claim 20, wherein the photomask comprises features at about a photolithographic resolution limit.

* * * * *